United States Patent [19]

Mantha

[11] Patent Number: 5,640,137
[45] Date of Patent: Jun. 17, 1997

[54] POLYSILICON RESISTOR COOLING

[75] Inventor: Bhaskar L. Mantha, Pleasanton, Calif.

[73] Assignee: Zilog, Inc., Campbell, Calif.

[21] Appl. No.: 378,240

[22] Filed: Jan. 24, 1995

[51] Int. Cl.⁶ ................................................ H01C 1/012
[52] U.S. Cl. .......................... 338/308; 338/195; 338/307; 338/309; 338/314
[58] Field of Search .......................... 338/51–54, 306, 338/307, 308, 309, 311, 314, 293

[56] References Cited

U.S. PATENT DOCUMENTS

| | | | |
|---|---|---|---|
| 4,853,669 | 8/1989 | Guckel et al. | 338/4 |
| 4,906,966 | 3/1990 | Imamura et al. | 338/195 |
| 5,530,418 | 6/1996 | Hsu et al. | 338/307 |

*Primary Examiner*—Tu B. Hoang
*Attorney, Agent, or Firm*—Majestic, Parsons, Siebert & Hsue

[57] ABSTRACT

The present invention involves adding additional structures to a polysilicon resistor which do not significantly affect the resistance of the polysilicon resistor. These additional structures add to the area of the polysilicon resistor, and therefore reduce the self-induced temperature change caused by the voltage across the resistor. Since the resistance of the polysilicon resistor depends on its temperature, the reduction of the self-induced temperature change lowers the variation in the resistance value at different voltages.

10 Claims, 2 Drawing Sheets

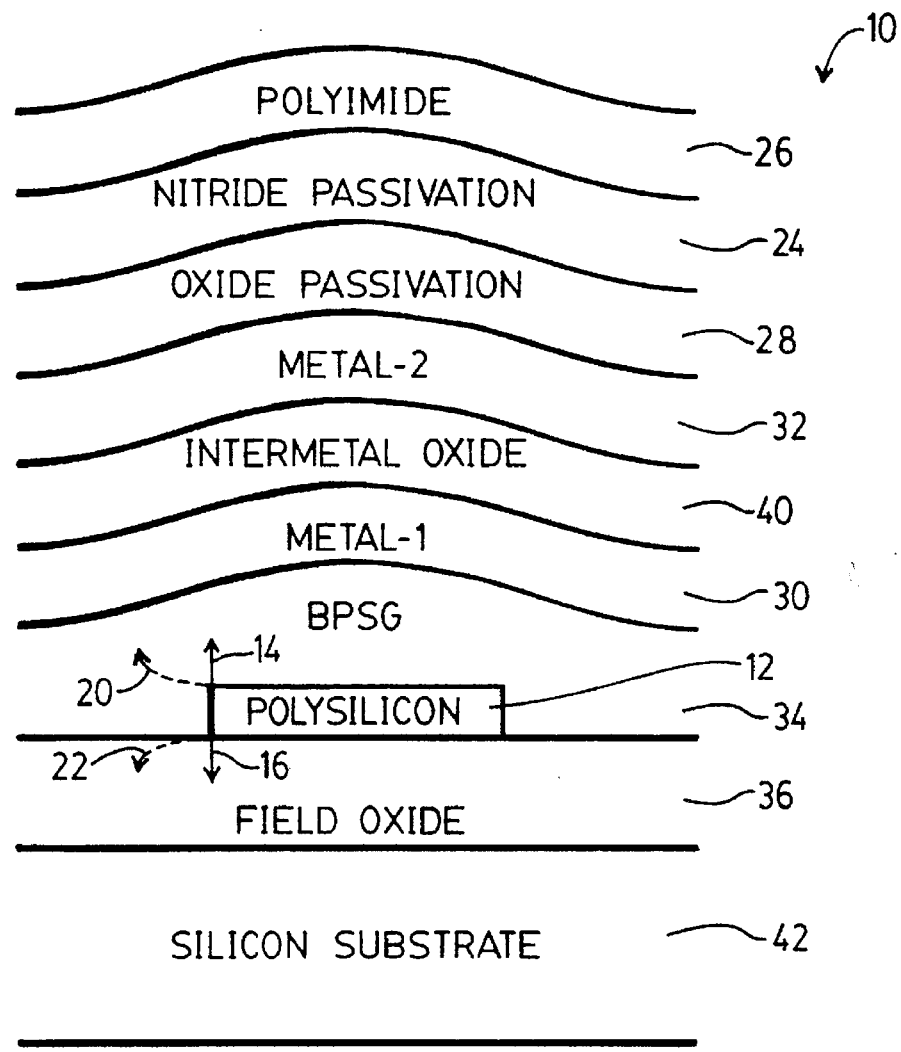
FIG._1A.
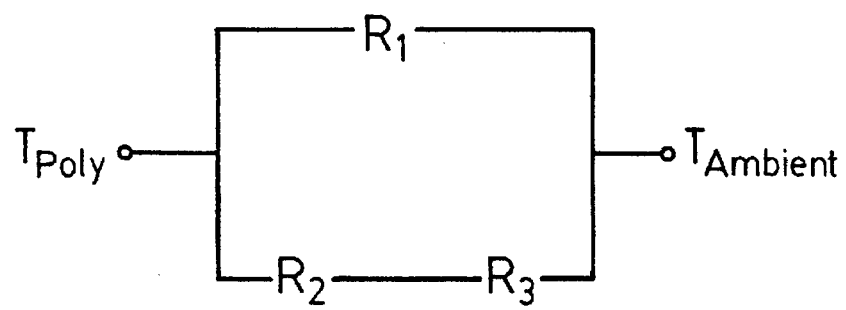
FIG._1B.

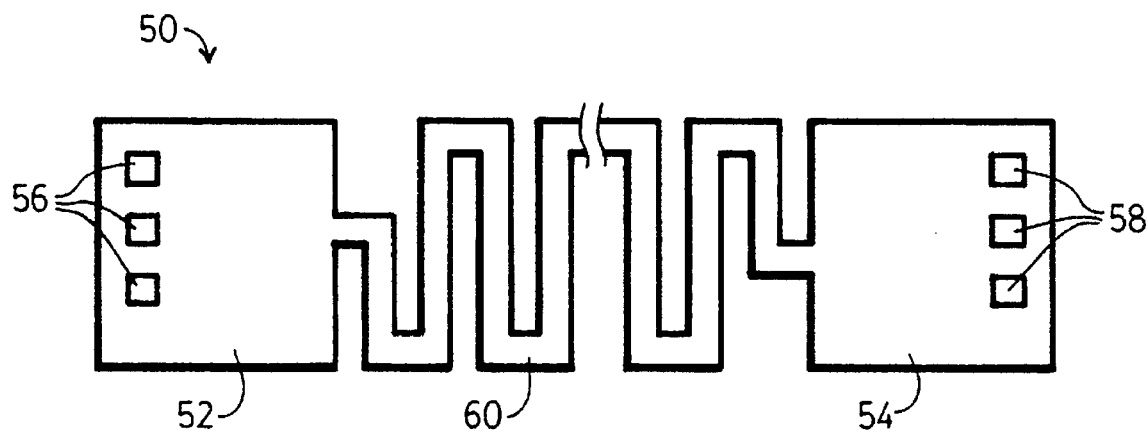
FIG._2.
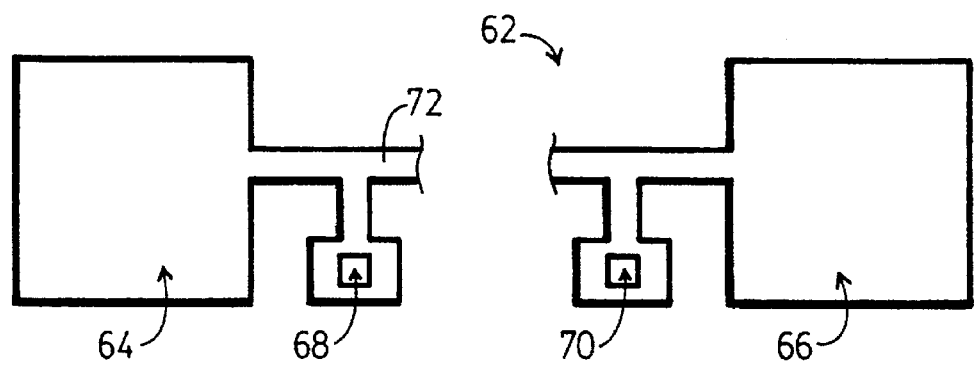
FIG._3.
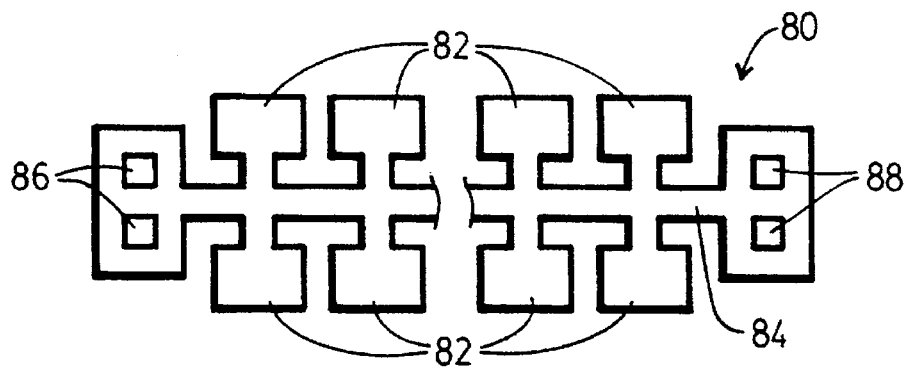
FIG._4.

POLYSILICON RESISTOR COOLING

BACKGROUND OF THE INVENTION

The present invention relates to polysilicon resistors used on semiconductor chips. Polysilicon resistors are strips of polysilicon doped with a material, such as phosphorus, to be made more conductive. Polysilicon resistors have a certain sheet resistance, which is a resistance per "square" which depends on the thickness of the polysilicon resistor. Polysilicon resistors are formed to have a fixed resistance determined by the number of squares that comprise the resistor. Polysilicon resistors have uses in circuits such as analog to digital converters.

It is desired to reduce the variation in the resistance value of the polysilicon resistors for different voltages across the resistor. If this variation of the polysilicon resistors value can be reduced, a more accurate analog-to-digital and digital-to-analog conversion can occur.

SUMMARY OF THE INVENTION

We have determined that much of the variation in the polysilicon resistance value which is seen for different voltages is actually the result of the self-induced temperature change. Power dissipated in the polysilicon resistor increases the temperature of the resistor. This increase in temperature affects the resistance of the polysilicon resistor. The present invention involves reducing the temperature change caused by power dissipation in the polysilicon resistor. This reduction in temperature change can be done by designing the polysilicon resistor such that the area is significantly increased without significantly changing the resistance. In this manner, the change in temperature for a given voltage difference across the polysilicon resistance is decreased.

The materials that surround the polysilicon resistor on the semiconductor chip are typically poor thermal conductors. By increasing the area of the polysilicon resistor, heat dissipation can be increased. The area of the polysilicon resistor can be increased, without significantly affecting the resistance of the polysilicon resistor, by adding large polysilicon pads at both ends. These large polysilicon pads are larger than needed to connect to the metal layer contacts. If these large polysilicon pads are larger than the size of the rest of the polysilicon resistor, the change in temperature for a given voltage difference can be significantly decreased. This results in a smaller resistance variation. Additionally, projections off of the conductive path of the polysilicon resistor could also be used to add to the area of the polysilicon resistor, while not significantly affecting the resistance.

In one embodiment, the polysilicon resistor can be designed having a main part which contributes the majority of the resistance. Secondary structures can increase the area of the polysilicon resistor without significantly affecting the resistance of the polysilicon structures. One way of having this effect is for the large polysilicon pads to be wider across the conductive path of the resistor than the elongated section. Another way of increasing the area of the polysilicon resistor without significantly affecting resistance is to have projections off of the conductive path.

BRIEF DESCRIPTION OF THE DRAWINGS

The above and other features and aspects of the present invention will become more apparent upon reading the following detailed description in conjunction with the accompanying drawings, in which:

FIG. 1A is a cross-sectional view of the semiconductor chip showing a polysilicon resistor;

FIG. 1b is a diagram showing the thermal circuit of the simple thermal model;

FIG. 2 is a diagrammatic view of a polysilicon resistor with large polysilicon pads;

FIG. 3 is a diagrammatic view of a polysilicon resistor with large pads without contacts; and FIG. 4 is a diagrammatic view of a resistor with projections off its side.

DETAILED DESCRIPTION OF THE PREFERRED EMBODIMENT

As discussed above, the resistance of the polysilicon resistor varies with the voltage applied. The extent to which this variation in the resistance is a result of a self-induced temperature change in the resistor due to power dissipation is discussed below. First, we will show experimental results of the variation of resistance at different voltages. This variation is assumed to include resistor value changes caused by the self-induced temperature change. Next, we will discuss an experimental determination of the variation of the sheet resistance caused by a change in the temperature. Using these two experimental results and a simple thermal model, we will estimate the extent to which the self-induced temperature change contributes to the variation in the resistance for different voltages.

With this information, we can prescribe ways to reduce the resistance variation resulting from the self-induced temperature change.

Sheet resistance variation with voltage was measured at an ambient room temperature. The heating of the polysilicon should be taken into consideration when determining the voltage coefficient. This is why the power dissipation, which is a product of the voltage and current, is also given for calculating the temperature of the polysilicon structure.

| Voltage (Volts) | Current (mA) | Power Dissipation (mW) | Sheet Rho (Ohms/Sq.) |
|---|---|---|---|
| 0.9978 | 0.646 | 0.6446 | 23.4028 |
| 1.2474 | 0.807 | 1.0067 | 23.4200 |
| 1.4980 | 0.969 | 1.4516 | 23.4230 |
| 1.7477 | 1.130 | 1.9749 | 23.4339 |
| 1.9975 | 1.291 | 2.5788 | 23.4432 |
| 2.4272 | 1.452 | 3.5243 | 23.4494 |
| 2.4968 | 1.613 | 4.0273 | 23.4534 |

Linear regression of the data indicates the following:

Slope=0.03296 Ohms/Sq./Volt

Intercept=23.3747 Ohms/Sq.

Correlation=0.9832

The percentage change per volt is determined to be 0.140. This translates into 1400 parts per million per volt.

The polysilicon sheet resistance variation with temperature was also determined experimentally. A two-terminal polysilicon resistor was tested. The resistor structure has a width of 25 microns and a length of 250 microns, and so comprises 10 squares. Sheet resistance measurements were made by varying the temperature from 27° C. to 150° C. The following table shows the polysilicon sheet resistance variation with temperature:

| Temp. (C.) | Sheet Rho R(T) | [R(T)/R(NOM)] − 1 | T-T(NOM) | R(T)-R(NOM) |
|---|---|---|---|---|
| 27(NOM) | 23.80 | 0.000 | 0 | 0.0 |
| 50 | 24.30 | 0.021 | 23 | 0.5 |
| 75 | 25.00 | 0.050 | 48 | 1.2 |
| 100 | 25.80 | 0.084 | 73 | 2.0 |
| 125 | 26.30 | 0.105 | 98 | 2.5 |
| 150 | 26.90 | 0.130 | 123 | 3.1 |

In the above table, the nominal temperature, T(NOM) is 27° C. and R(NOM) is the sheet resistance per square (rho) at the nominal temperature. The sheet resistance per square at any other temperature T is R(T).

An equation for the resistance is:

$$[R(T)/R(NOM)] - 1 = TC1 * [T - T(NOM)] \quad (1)$$

where TC1 is a constant.

Using a linear regression best fit, the following TC1 value and correlation coefficient are obtained:

$$TC1 = 1.110E-3/C$$

Correlation coefficient=0.998

The increase of sheet resistance per square with increasing temperature is due to a decrease of electron mobility with increase of temperature.

The temperature coefficient in the equation (1) given above depends on the resistance at the nominal temperature. The temperature coefficient can be made independent of the resistance at the nominal temperature using the following equation:

$$R(T) = R(NOM) + \alpha[T - T(NOM)] \quad (2)$$

where $\alpha$ is a temperature coefficient of resistance. $\alpha$ is determined to be 0.0264 Ohms/square/C. The percent sheet rho variation per degree Centigrade is 0.111. This translates to 1110 ppm/C.

FIG. 1A is a cross-sectional view of a semiconductor chip 10 showing the polysilicon resistor 12. In order to determine the portion of the sheet resistance variation for different voltages that is a result of the self-induced temperature change, we need to know the extent of this temperature change in the resistor. We used a simple thermal model to determine the temperature of the polysilicon resistor for a given voltage. Four assumptions were made:

(1) Heat flow from the polysilicon 12 to regions above and below is confined to the polysilicon's dimensions. In other words, fringing heat flow is not taken into account. The heat is assumed to be dissipated along the direction of arrows 14 and 16, but not along the directions of arrows 20 and 22 shown in phantom.

(2) The total power dissipation was assumed to be the average power dissipation for all currents, which is approximately 2.25 mW.

(3) The thermal conductivities of the nitride passivation layer 24 and polyimide layer 26 were assumed to be the same as that of the oxide passivation layer 28.

(4) The entire polysilicon structure is assumed to be uniformly heated. This is a reasonable assumption since the conductivity of polysilicon 12 is significantly greater than the conductivities of the borophosphorus silicon glass (BPSG) layer 34 and field oxide layer 36. For this reason, the polysilicon resistor 12 will heat to a substantially uniform temperature before a significant amount of heat dissipates through the BPSG layer 34 or field oxide layer 36.

The model also assumes that the heat flow can be viewed analogously to electrical flow, wherein the thermal power is analogous to the current, the temperature is analogous to the voltage, the thermal conductivity is analogous to the electrical conductivity, and the thermal resistance is analogous to the electrical resistance.

The polysilicon structure has a BPSG layer 34, intermetal oxide layer 40, oxide passivation layer 28, nitride passivation layer 24, and polyimide layer 26 placed on top of the polysilicon 12. A field oxide layer 36 and a silicon substrate 42 are located below the polysilicon resistor 12. The top of the polyimide layer 26 and the bottom of the silicon substrate 42 are assumed to be at the ambient temperature. The polysilicon dimensions, thicknesses, and thermal conductivities are given below:

| | |
|---|---|
| Polysilicon dimensions | L = 429μ |
| | W = 6.5μ |
| | Area = 2.8E-5 cm² |
| Polysilicon thickness | 2800Å |
| Field oxide thickness | 6000Å |
| Wafer thickness | 525μ |
| Polyoxide thickness | 1200Å |
| BPSG thickness | 4700Å |
| Intermetal ox. thickness | 11,000Å |
| Oxide + Nitride passivation thickness | 18,000Å |
| PIX (polyimide) thickness | 25,500Å |
| Thermal conductivity of oxide | 0.014 Watts/K-cm |
| Thermal conductivity of silicon | 1.5 Watts/K-cm |

From the dimensions and thermal conductivity numbers, thermal resistances were calculated to be:

| | |
|---|---|
| Oxide above polysilicon ($R_1$) | 1226 K/Watt |
| Field oxide ($R_2$) | 153 K/Watt |
| Silicon substrate ($R_3$) | 1240 K/Watt |

FIG. 1B is a diagram showing the thermal circuit of the simple thermal model. $T_{poly}$ is the temperature of the polysilicon, and $T_{ambient}$ is the ambient temperature.

The relation between the thermal resistance and temperature difference is:

$$T_{poly} - T_{ambient} = R_{equivalent} * \text{power} \quad (3)$$

where $R_{equivalent}$ is the equivalent thermal resistance assumed to be given by $R_1(R_2+R_3)/(R_1+R_2+R_3)$.

The equivalent thermal resistance between the polysilicon and ambient for the example above is calculated to be 652 K/W. For the measurements discussed above, this gives a 1.467° C. higher polysilicon temperature than ambient temperature. Multiplying this number by the 1100 part per million/C temperature variation produces approximately 1600 parts per million of resistance change. Thus, the calculated polysilicon sheet resistance variation attributable to the self-induced temperature change is on the order of the 1400 parts per million/V value calculated above. Since the voltage co-efficient for polysilicon resistors is positive according to published reports, we will assume a voltage coefficient that can solely be attributed to the voltage, not including variation caused by the self-induced temperature change of less than 200 parts per million per volt.

The resistor values used in the preferred embodiment are on the order of 50K Ohms. For a 25 Ohms/square polysilicon sheet rho, 2000 squares are used. If the polysilicon line width is assumed to be 1 micron, the polysilicon line length will be 2000 microns. The area will be 2000µ². The thermal resistance values can be calculated to be:

| | |
|---|---|
| $R_1$ (Oxide above polysilicon) | 2160 K/W |
| $R_2$ (Field Oxide) | 214 K/W |
| $R_3$ (Silicon Substrate) | 1740 K/W |
| Equivalent Thermal Resistance | 1025 K/W |

If five volts is applied across the resistor, the current will be 100 µA. The power dissipation will be 0.5 mW. The temperature rise of the polysilicon can be calculated to be 0.51° C. This rise corresponds to 570 parts per million change in resistance, due to the temperature increase alone. This means that, even for large value resistors, the resistance change due to self-heating of the polysilicon can be significant.

The thermal resistance can be reduced if the film thicknesses, such as BPSG thickness, passivation thickness, etc. can be reduced. These thicknesses, however, are fixed by the process technology used. Having metal-1 layer 30 or metal-2 layer 32 directly above the resistor structure does not help either, because these layers will be in series with the thermal resistances of the oxide films above the polysilicon, such as the BPSG 34 and intermetal oxide 40 as shown in FIG. 1A.

In the present invention, the thermal resistance is decreased by increasing the area of the polysilicon structure 12. For a given polysilicon structure, the area can be increased without significantly changing the resistor value of the polysilicon resistor. By doing this, the self-induced temperature change will be reduced for a given voltage and the observed resistance variation due to the voltage across the resistor will be reduced.

Ways of increasing the polysilicon resistor's area without significantly affecting the resistance are illustrated in FIGS. 2–4. A main part of a polysilicon resistor, typically a narrow elongated section, contributes to most of the resistance. Secondary structures are designed to be added to the main part. These secondary structures do not significantly add to the resistance, but significantly add to the total area of the polysilicon resistor. FIGS. 2–4 show different types of layouts that can be done in order to increase the heat dissipation while not significantly affecting the resistance.

FIG. 2 is a diagrammatic view of a resistor 50 with large polysilicon pads 52 and 54. Contacts 56 and 58 are also shown. This diagram is not to scale. Assuming that the main elongated part 60 comprises 2000 squares, each 1 micron by 1 micron in size, if the large polysilicon pads 52 and 54 have a size of 50 microns by 50 microns, the total area increases to (5,000+2,000)=7,000µ². The thermal resistances for this total area are $R_{1=}617$ K/W, $R_{2=61}$ K/W, and $R_{3=495}$ K/W. The equivalent thermal resistance will be 290 K/W with a corresponding resistance change for temperature of 160 parts per million. The equivalent thermal resistance can be decreased even greater down to 150 K/W, if 60 micron by 60 micron pads are used with a corresponding part per million sheet resistance change of 84 parts per million. Note that if pads 54 and 52 are fifty microns by fifty microns wide, these pads 52 and 54 are significantly wider in the direction perpendicular to the current path than the main elongated section 60. The polysilicon pads 52 and 54 are fifty microns across, while the elongated main part 60 is only one micron across. The pads 52 and 54 are each one square so that the combined resistance of the pads is 50 Ohms. This is about 1/1000th of the total resistance of around 50K Ohms. Note that use of a secondary structure which adds only ten percent to the resistance of the polysilicon resistor, but is around the same size as the main elongated section, can reduce the resistance variation caused by the self-induced temperature change by about forty five percent.

Since the total thermal resistance is inversly proportional to the area of the polysilicon resistor, expanding the area of the polysilicon resistor decreases the temperature change in the resistor and so decreases the change in resistance due to self heating.

FIG. 3 is a diagrammatic view of a polysilicon resistor 62 with large pads 64 and 66. These pads 64 and 66 do not contain the contacts 68 and 70. The main section 72 connects between the contacts 68 and 70. The pads 64 and 66 are used to cool the polysilicon resistor and reduce the self-induced temperature change.

FIG. 4 is a diagrammatic view of a resistor 80 of an alternate embodiment of the present invention showing the projections 82 which add to the area of the polysilicon resistor 80, but do not significantly add to the resistance of the polysilicon resistor 80. The main section 84 is delineated from the projections 82 by dotted lines. Contacts 86 and 88 are also shown.

In the present invention, substantial benefits can be obtained if the secondary structures, which add to the area of the polysilicon resistor without significantly adding to the resistance of the polysilicon resistor, are larger than the main part of the polysilicon resistor. For the embodiment in which two 50 micron by 50 micron pads are added to a elongated section of area 2000 micron squares, the secondary structures, the pads, are two and one-half times the area of the elongated main part.

Practical limitations of increasing the area of the polysilicon resistor include chip area on the wafer and a possible parasitic capacitance effect between polysilicon and the silicon substrate.

Various details of the implementation and method are merely illustrative of the invention. It will be understood that various changes in such details may be within the scope of the invention, which is to be limited only by the appended claims.

What is claimed is:

1. A polysilicon resistor on a semiconductor chip, the polysilicon resistor defining a top surface area comprising:
   a main section formed of a polysilicon material, said main section being substantially elongated;
   secondary structures formed of a polysilicon material and attached to the main section, and
   electrical contacts attached to the polysilicon resistor, the contacts electrically connected to two ends of the main section, wherein said secondary structures adding to the top surface area of the polysilicon resistor but not significantly affecting the total electrical resistance of the polysilicon resistor between the electrical contacts, said secondary structures include projections attached to the main section wherein the polysilicon resistor is shaped such that a shortest path defined between the contacts through the polysilicon resistor does not extend into said projections, wherein the projections are narrower at locations where the projections are attached to the main section than at other sections of the projections and the electrical contacts are not located in the projections.

2. The polysilicon resistor of claim 1, wherein said main section and said secondary structures have the same sheet resistance.

3. The polysilicon resistor of claim 1, wherein said main section is serpentine-shaped.

4. The polysilicon resistor of claim 1, wherein a top surface area of the secondary structures is larger than a top surface area of the main section.

5. The polysilicon resistor of claim 4, wherein the top surface area of the secondary structures is at least 2.5 times larger than the top surface area of the main section.

6. The polysilicon resistor of claim 1, wherein the polysilicon resistor is covered by an insulative layer having a thermal conductivity less than the polysilicon layer.

7. The polysilicon resistor of claim 1, wherein said contacts are on pads at the ends of the main section.

8. A polysilicon resistor on a semiconductor chip, the polysilicon resistor defining a resistance between two contacts, said polysilicon resistor comprising:

an elongated section of polysilicon; and pads connected to the elongated section, said pads containing contacts on both ends, said pads contributing less than ten percent of a resistance of the polysilicon resistor between the contacts, but having a top surface area larger than the elongated section, wherein the pads and the elongated section have the same sheet resistance.

9. The polysilicon resistor of claim 8, wherein a combined top surface area of the pads is at least 2.5 times larger than the area of the elongated section.

10. The polysilicon resistor of claim 8, wherein the elongated section is serpentine-shaped.

* * * * *